(12) United States Patent
Kunimoto et al.

(10) Patent No.: US 11,428,824 B2
(45) Date of Patent: Aug. 30, 2022

(54) SCINTILLATOR MODULE, SCINTILLATOR SENSOR UNIT, AND MANUFACTURING METHOD

(71) Applicant: YMIT Co., Ltd., Yasu (JP)

(72) Inventors: Fumiaki Kunimoto, Shiga (JP); Satomi Onishi, Shiga (JP)

(73) Assignee: YMIT Co., Ltd., Yasu (JP)

( * ) Notice: Subject to any disclaimer, the term of this patent is extended or adjusted under 35 U.S.C. 154(b) by 0 days.

(21) Appl. No.: 17/423,253

(22) PCT Filed: Apr. 9, 2019

(86) PCT No.: PCT/JP2019/015496
§ 371 (c)(1),
(2) Date: Jul. 15, 2021

(87) PCT Pub. No.: WO2020/208716
PCT Pub. Date: Oct. 15, 2020

(65) Prior Publication Data
US 2022/0043171 A1 Feb. 10, 2022

(51) Int. Cl.
*C23C 14/24* (2006.01)
*G01T 1/202* (2006.01)
(Continued)

(52) U.S. Cl.
CPC ............ *G01T 1/2023* (2013.01); *C23C 14/24* (2013.01); *G01T 1/20187* (2020.05); *G21K 4/00* (2013.01)

(58) Field of Classification Search
CPC ..... G01T 1/2023; G01T 1/2087; C23C 14/24; G21K 4/00
See application file for complete search history.

(56) References Cited

U.S. PATENT DOCUMENTS

2003/0107001 A1* 6/2003 Baumgartner ........ G01T 1/2928
250/370.11
2005/0285045 A1 12/2005 Baumgartner et al.
(Continued)

FOREIGN PATENT DOCUMENTS

JP 2003-262676 A 9/2003
JP 2010-25620 A 2/2010
(Continued)

OTHER PUBLICATIONS

International Search Report dated Jul. 2, 2019 in PCT/JP2019/015496 filed Apr. 9, 2019, 4 pages.
(Continued)

*Primary Examiner* — David P Porta
*Assistant Examiner* — Fani Polyzos Boosalis
(74) *Attorney, Agent, or Firm* — Oblon, McClelland, Maier & Neustadt, L.L.P.

(57) ABSTRACT

A scintillator module includes a substrate, a columnar scintillator crystal layer formed on the substrate, and a non-adhesive moisture-proof member having a given hardness and opposing a crystal growing side of the columnar scintillator crystal layer. The moisture-proof member ensures a void between the moisture-proof member and individual conic peak portions of columnar scintillator crystals forming the columnar scintillator crystal layer under vacuum sealing, and holds the columnar scintillator crystal layer in a moisture-proof state between a moisture-proof layer and the substrate.

7 Claims, 9 Drawing Sheets

(51) Int. Cl.
*G01T 1/20* (2006.01)
*G21K 4/00* (2006.01)

(56) References Cited

U.S. PATENT DOCUMENTS

| | | | |
|---|---|---|---|
| 2012/0001282 A1 | 1/2012 | Goto et al. | |
| 2013/0284933 A1 | 10/2013 | Nakatsugawa et al. | |
| 2013/0313667 A1* | 11/2013 | Homma | G01T 1/244 |
| | | | 257/428 |
| 2013/0322598 A1 | 12/2013 | Saruta et al. | |
| 2015/0247934 A1* | 9/2015 | Toyama | G01T 1/2018 |
| | | | 250/366 |

FOREIGN PATENT DOCUMENTS

| | | |
|---|---|---|
| JP | 2010-261720 A | 11/2010 |
| JP | 2012-37454 A | 2/2012 |
| JP | 2012-137438 A | 7/2012 |
| JP | 2012-159398 A | 8/2012 |
| JP | 2014-13230 A | 1/2014 |
| JP | 2014-59172 A | 4/2014 |
| JP | 2016-95189 A | 5/2016 |
| JP | 2019-49437 A | 3/2019 |
| KR | 10-2013-0139846 A | 12/2013 |
| KR | 10-2014-0115982 A | 10/2014 |

OTHER PUBLICATIONS

Japanese Notice of Reasons for Refusal dated Feb. 13, 2020 in Japanese Patent Application No. 2019-571555 filed Apr. 9, 2019, 11 pages (with English Translation).

Notification of Reason for Refusal dated Jan. 17, 2022 in Korean Patent Application No. 10-2021-7031584 (with English machine translation), 13 pages.

Extended European Search Report dated Jun. 21, 2022 in corresponding European Patent Application No. 19924562.2, 8 pages.

* cited by examiner

SCINTILLATOR MODULE, SCINTILLATOR SENSOR UNIT, AND MANUFACTURING METHOD

CROSS-REFERENCE TO RELATED APPLICATIONS

This application is a national stage application of International Application No. PCT/JP2019/015496, filed Apr. 9, 2019, which designates the United States, the entire contents of which are incorporated herein by reference.

TECHNICAL FIELD

Embodiments of the present invention relate to a scintillator module, a scintillator sensor unit, and a manufacturing method.

BACKGROUND ART

Required performance (performance requirements) of a scintillator includes high luminance and higher resolution, for example.

In the recent medical field, in particular, great emphasis has been placed on generation of high-quality X-ray images with lower radiation doses.

Alkali halide scintillators include, for example, columnar CsI:T1 crystals which exert optical guide effects for visible light emitted in the crystals.

Alkali halide scintillator crystals are mostly deliquescent so that they may lower in performance when deliquescing. To form a scintillator, a moisture-proof layer is thus essential to isolate scintillator crystals from outside.

CITATION LIST

Patent Literature

Patent Document 1: Japanese Laid-open Patent Application Publication No. 2014-013230
Patent Document 2: Japanese Laid-open Patent Application Publication No. 2012-137438

SUMMARY OF INVENTION

Problem to be Solved by the Invention

Meanwhile, as to scintillators, a high-luminance output and a high-resolution output have a trade-off relationship, therefore, it is difficult to enhance both luminance and resolution at the same time. It is thus required to provide a method for maintaining a state of columnar scintillator crystals having a given degree of performance to be able to fully exhibit their intrinsic performance.

In this regard, examples of conventional methods include fixing and vacuum-sealing a layered film containing a moisture-proof layer to the surfaces of columnar scintillator crystals with an adhesive; and forming a moisture-vapor barrier layer directly on the surfaces of columnar scintillator crystals by metal deposition or parylene coating.

However, these methods may cause optical loss or decrease in crystal sharpness.

In view of this, an object of the present invention is to provide a scintillator module, a scintillator sensor unit, and a manufacturing method that enable columnar scintillator crystals to exert their intrinsic performance (in terms of resolution and luminance) without optical loss or decrease in crystal sharpness.

Means For Solving Problem

A scintillator module according to one embodiment includes a substrate: a columnar scintillator crystal layer formed on the substrate: and a non-adhesive moisture-proof member having a given hardness and opposing a crystal growing side of the columnar scintillator crystal layer, the moisture-proof member that ensures a void between the moisture-proof member and individual conic peak portions of columnar scintillator crystals forming the columnar scintillator crystal layer under vacuum sealing, and holds the columnar scintillator crystal layer in a moisture-proof state between the moisture-proof layer and the substrate.

DESCRIPTION OF EMBODIMENTS

The following will describe preferred embodiments with reference to the accompanying drawings.

Prior to explanation of the embodiments, conventional inconveniences and the principles of the embodiments are described.

Alkali halide scintillators require a moisture-proof layer because of deliquesce of columnar CsI:T1 crystals, for example, as described above.

Conventionally, a CsI:T1 scintillator is given a moisture-proof property by, for example, fixing a layered film containing a moisture-proof layer to the surface of the CsI:T1 scintillator with an adhesive for vacuum-sealing.

Figure 12:
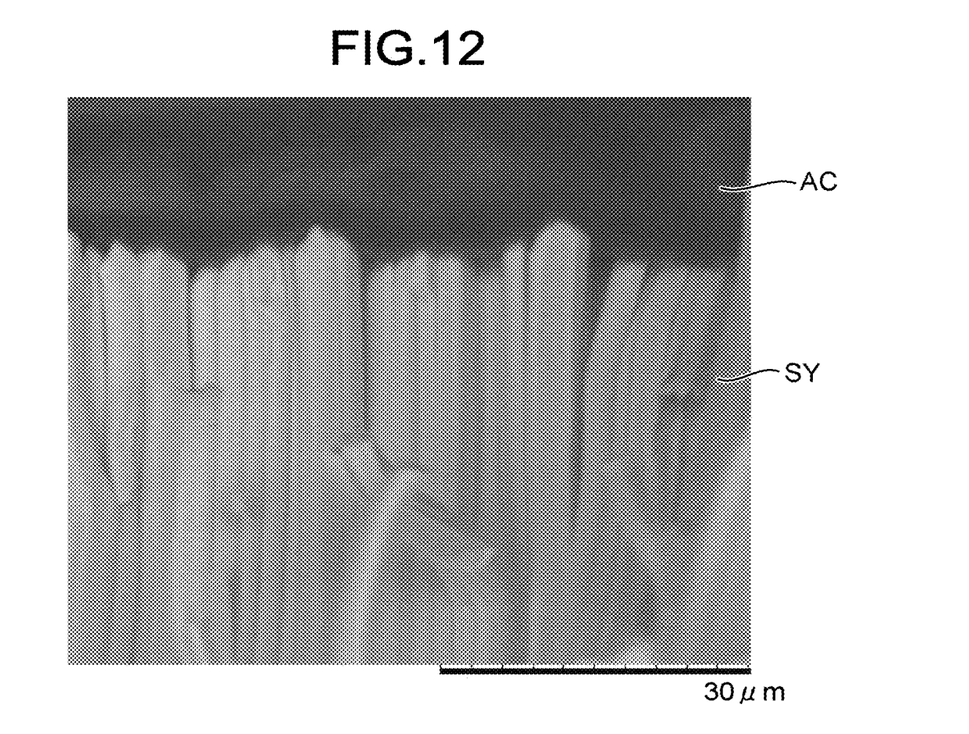
FIG. 12 is a microscopic sectional image of a CsI:T1 scintillator with the surface to which a layered film is fixed with an acrylic pressure sensitive adhesive.

FIG. 12 illustrates a microscopic sectional image of a CsI:T1 scintillator with the surface to which a layered film is fixed with an acrylic pressure sensitive adhesive.

Due to its softness, the acrylic pressure sensitive adhesive AC enters the gaps among the peaks of crystals in the CsI:T1 scintillator SY, causing decrease in crystal sharpness.

Figure 13:
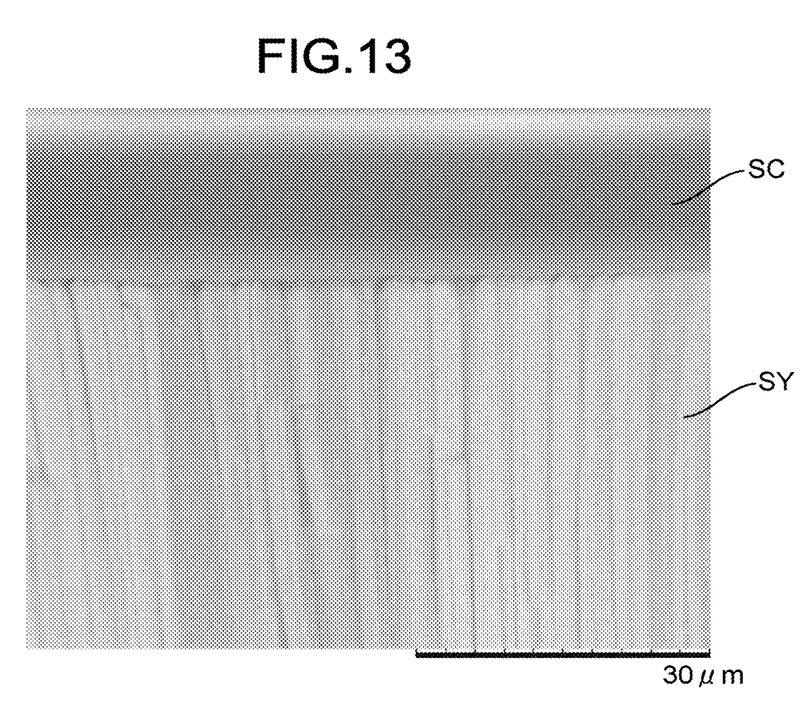
FIG. 13 is a microscopic sectional image of a CsI:T1 scintillator with the surface to which a layered film is fixed with a silicone pressure sensitive adhesive.

FIG. 13 is a microscopic sectional image of a CsI:T1 scintillator with the surface to which a layered film is fixed with a silicone pressure sensitive adhesive.

Unlike the acrylic pressure sensitive adhesive AC illustrated in FIG. 12, the silicone pressure sensitive adhesive SC having adequate hardness does not enter the gaps among the peaks of crystals in the CsI:T1 scintillator SY. When vacuum-sealed, however, the silicone pressure sensitive adhesive covers and tightly adheres to the entire unevenness of the peaks of crystals in the CsI:T1 scintillator. Reaction occurring at the interface between the CsI:T1 scintillator SY and the moisture-proof layer may cause optical loss and decrease in crystal sharpness.

In view of solving such inconveniences, the inventors of the present invention conducted a study and found that the interface between the moisture-proof layer and the peaks of crystals changes in shape depending on the adhesion and hardness of the outermost surface of a material of the moisture-proof layer, and that the CsI:T1 scintillator is likely to substantially lower in resolution if there are no voids at the peaks of crystals.

That is, it was found that it is possible to avoid degradation of the resolution by maintaining the void between the moisture-proof layer and the peaks of crystals in a vacuum adsorbed state by vacuum-sealing.

The following will describe embodiments specifically, taking, as an example, CsI:T1 being a typical alkali halide scintillator formed of columnar crystals.

1. First Embodiment

In a first embodiment a sensor is disposed on the peak side of columnar CsI:T1 crystals, by way of example.

In the following description, the peak side of columnar crystals refers to a direction in which the crystals grow at the time of formation of columnar crystals.

As described above, the peaks of the columnar CsI:T1 crystals have a substantially conic shape.

Figure 1:
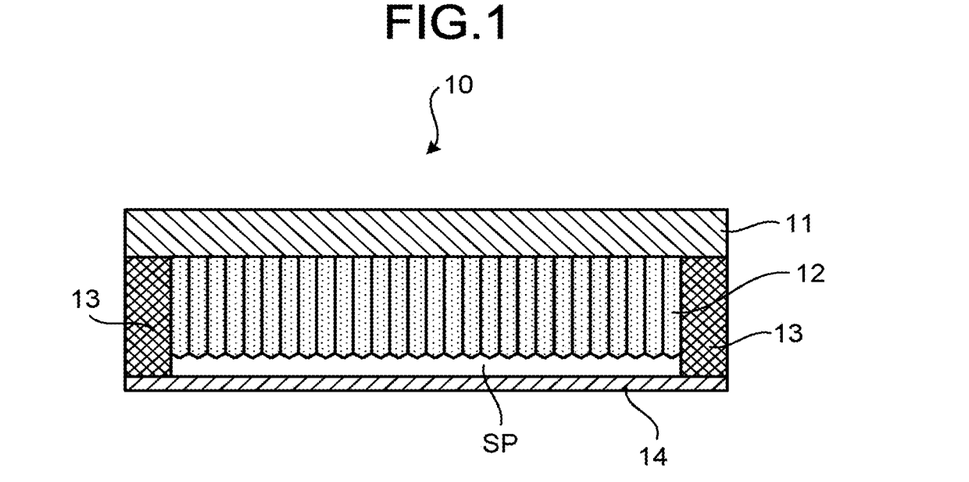
FIG. 1 is a view illustrating a scintillator module according to a first embodiment.

FIG. 1 is a view illustrating a scintillator module according to the first embodiment.

A scintillator module 10 according to the first embodiment includes a substrate 11 having a high visible-light reflectance; a scintillator layer 12 formed of columnar CsI:T1 crystals on the substrate 11 by vapor deposition; a seal member 13 having adhesiveness and formed to surround the scintillator layer 12; and a moisture-proof film 14 serving as a non-adhesive layered film to bond with the seal member 13 to seal the scintillator layer 12 between the moisture-proof film 14 and the substrate 11. The moisture-proof film 14 is non-adhesive and has a high visible-light transmittance.

In the above structure, the substrate 11 having a high visible-light reflectance may be such that the substrate 11 itself has a high visible-light reflectance or a reflective layer with a high visible-light reflectance is formed on one side of the substrate 11, the side facing the scintillator layer 12.

The scintillator layer 12 is sealed by the moisture-proof film 14 under a given vacuum environment. After the sealing, in the scintillator module under the atmospheric pressure there is a void formed between the peak side of the scintillator layer 12 of columnar CsI:T1 crystals and the moisture-proof film 14.

A state of the scintillator module with a void formed is now described.

The columnar CsI:T1 crystals constituting the scintillator layer 12 are substantially in the form of pillars. In the crystal growing direction the peak portions have a substantially conic shape.

In the present embodiment, the state of the scintillator module with a void formed refers to the conic surfaces of the conic peak portions of the columnar CsI:T1 crystals of the scintillator layer 12 entirely uncovered or only partially covered.

Figure 2A:
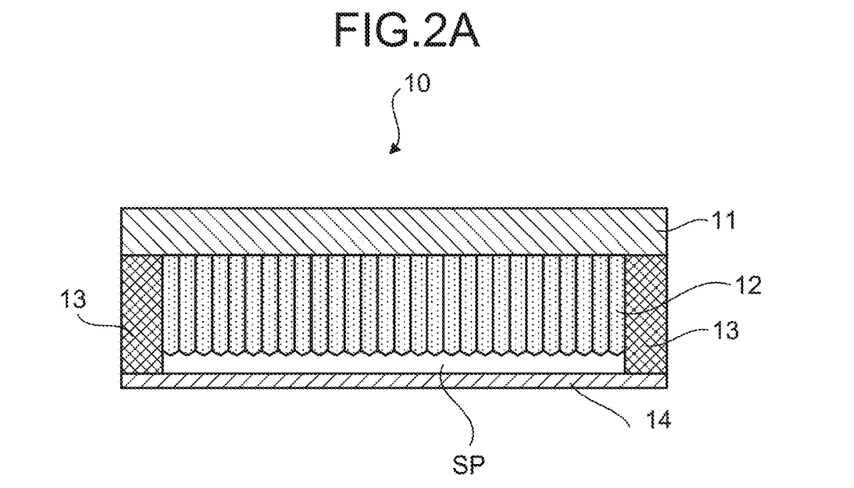
FIGS. 2A to 2C are views illustrating the scintillator module with a void formed.
Figure 2B:
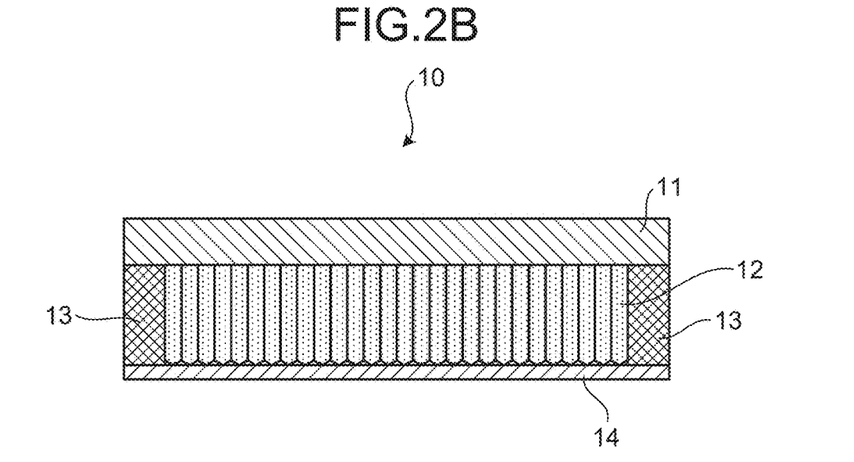
Figure 2C:
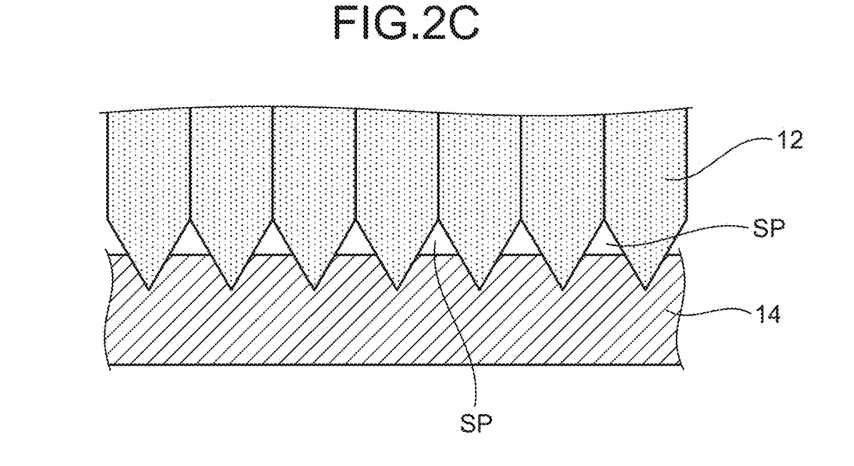

FIGS. 2A to 2C are views illustrating a state of the scintillator module with a void formed.

Specifically, in a first void-formed state, as illustrated in FIG. 2A, the moisture-proof film 14 is in no contact with the scintillator layer 12.

Thus, a void (space) SP is present between the moisture-proof film and the scintillator layer 12 entirely.

In a second void (SP) formed state, as illustrated in FIG. 2B, the moisture-proof film 14 is in contact with the scintillator layer 12.

As illustrated in the enlarged view of FIG. 2C, however, at least part (the top part in FIG. 2C) of the conic surfaces of the conic portions of the columnar CsI:T1 crystals remains in no contact with the moisture-proof film 14.

That is, voids (spaces) SP are present between the truncated conical portions and the moisture-proof film 14.

In either of the above states, the scintillator module 10 can exert higher resolution and higher luminance at the same time.

Figure 3:
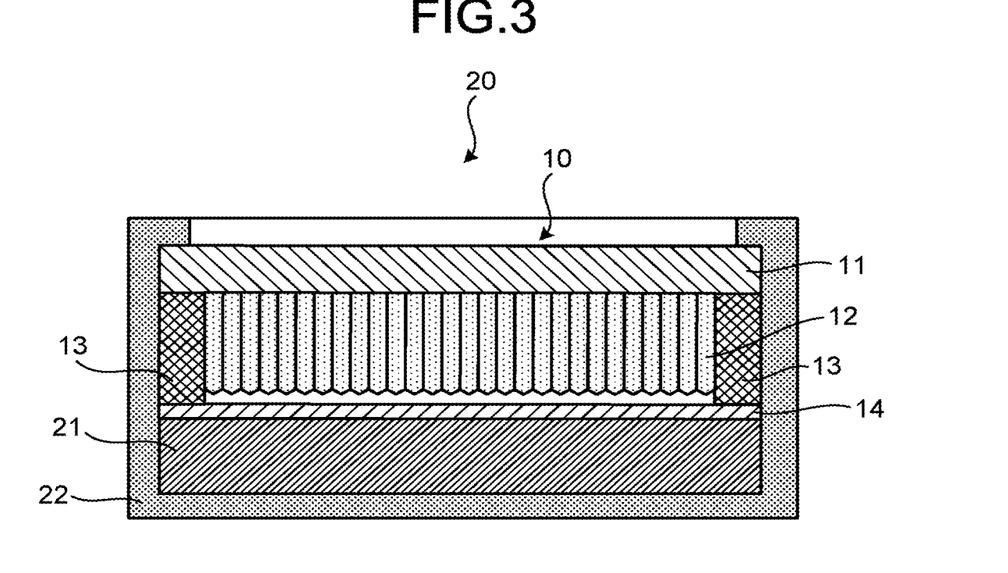
FIG. 3 is a view illustrating a schematic structure of a scintillator sensor unit according to the first embodiment.

FIG. 3 is a view illustrating a schematic structure of a scintillator sensor unit according to the first embodiment.

A scintillator sensor unit 20 in the first embodiment includes a light receiving unit 21 placed at the peak side of the columnar CsI:T1 crystals. The light receiving unit 21 includes a plurality of photodiodes arranged in a grid form.

Thus, in the scintillator sensor unit 20 of the first embodiment, the substrate 11, the scintillator layer 12, and the moisture-proof film 14 of the scintillator module 10, and the light receiving unit 21 are disposed and fixed in order from the incident side of an X-ray inside a casing 22.

Radiation such as an X-ray or a gamma ray is incident on the scintillator sensor unit 20 from above in FIG. 3 and reaches the scintillator layer 12.

Figure 4:
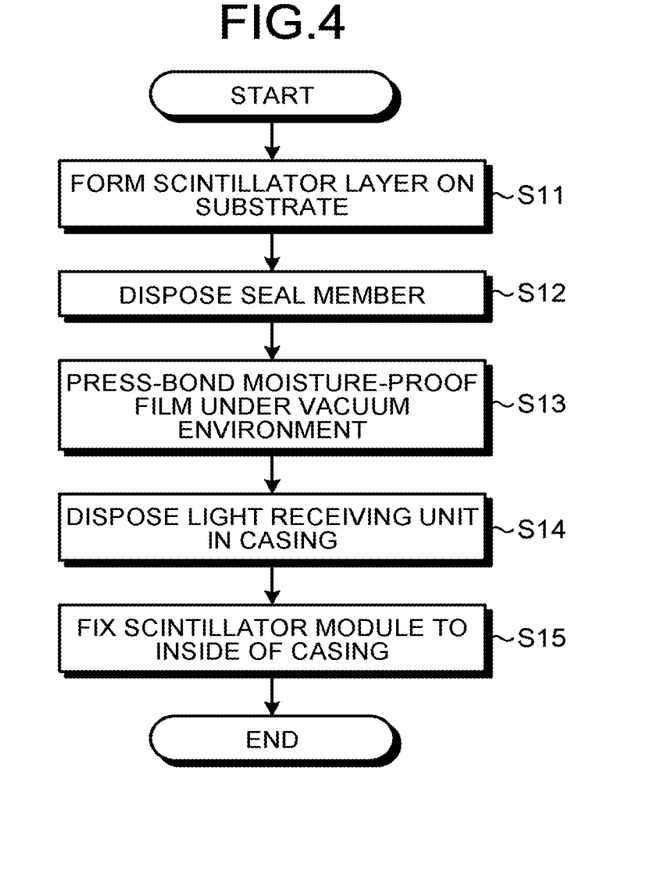
FIG. 4 is a flowchart illustrating the outline of a manufacturing process of the scintillator sensor unit.

Next, a manufacturing process of the scintillator sensor unit in the first embodiment is described, FIG. 4 is a flowchart illustrating the outline of the manufacturing process of the scintillator sensor unit.

Figure 5A:
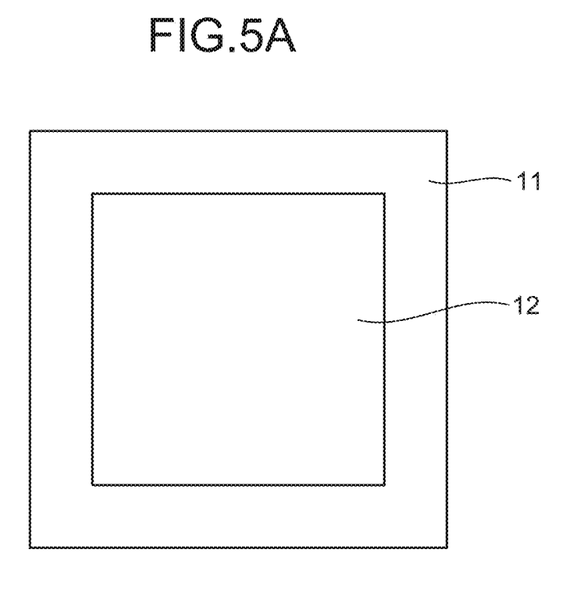
FIGS. 5A to 5C are views (Part 1) illustrating the manufacturing process of the scintillator sensor unit.
Figure 5B:
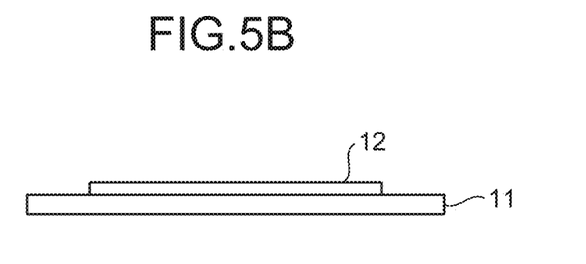
Figure 5C:
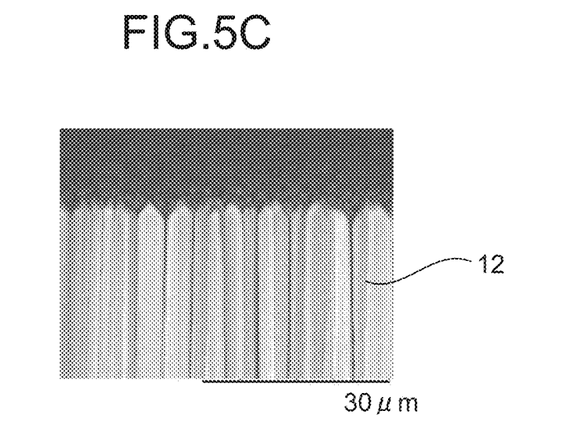

FIGS. 5A to 5C illustrate the manufacturing process (Part 1) of the scintillator sensor unit.

Figure 6A:
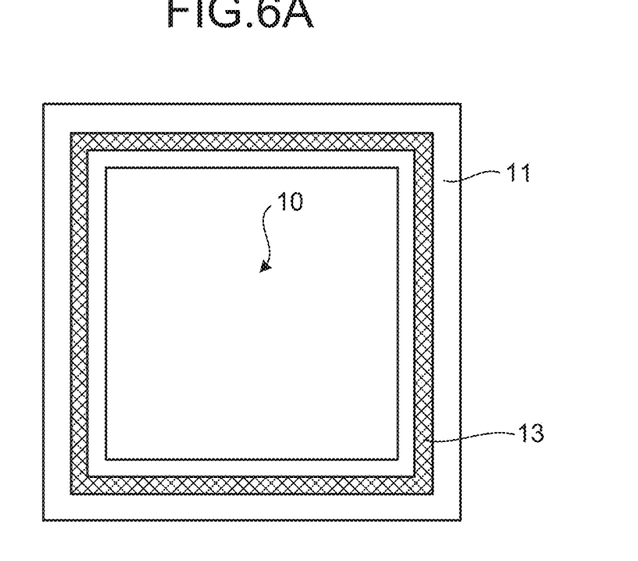
FIGS. 6A to 6C are views (Part 2) illustrating the manufacturing process of the scintillator sensor unit.
Figure 6B:
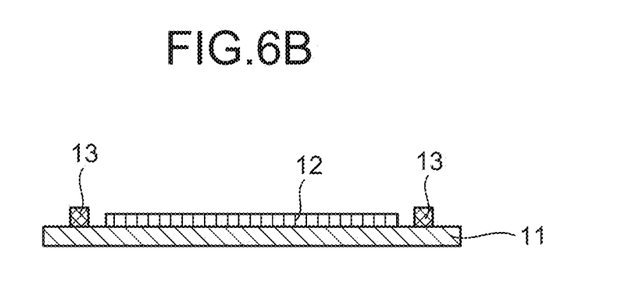
Figure 6C:
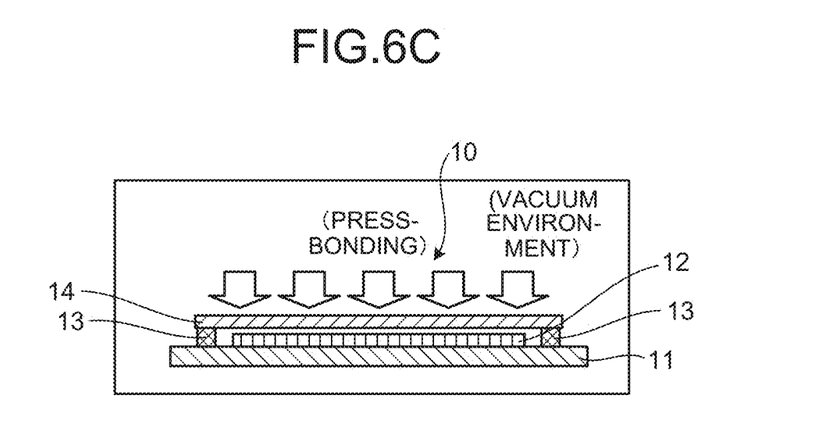

FIGS. 6A to 6C illustrate the manufacturing process (Part 2) of the scintillator sensor unit.

First, the fabrication procedure of the scintillator module according to the first embodiment is described.

As illustrated in FIGS. 5A and 5B, CsI:T1 is vapor-deposited on the substrate 11 having a high visible-light reflectance, to create, by vapor deposition, the scintillator layer 12 formed of columnar CsI:T1 crystals of a rectangular shape in a plan view (Step S11).

In such a state, as illustrated in FIG. 5C, the scintillator layer 12 including columnar CsI:T1 crystals with their peaks of a substantially conic shape in the crystal growing direction is formed on the substrate 11.

Subsequently, as illustrated in FIGS. 6A and 6B, the adhesive seal member 13 is placed to surround the scintillator layer 12 on the substrate 11 and adhere to the substrate 11 (Step S12).

As illustrated in FIG. 6C, the substrate 11 to which the seal member 13 adheres and the moisture-proof film 14 are then placed under a vacuum environment, and the moisture-proof film 14 is set, facing the scintillator layer 12, and is press-bonded to the seal member 13 for vacuum-sealing (Step S13).

As a result, the moisture-proof film 14 is prevented from tightly adhering to the unevenness ascribable to the conic portions of the peaks of columnar CsI:T1 crystals, and there is a void between the moisture-proof film 14 and the scintillator layer 12. Thereby, the scintillator module can exert higher luminance and higher resolution.

Subsequently, the light receiving unit 21 is placed in the casing 22 (Step S14).

The scintillator module 10 is then set opposite the light receiving unit 21 and fixed to the inside of the casing 22, thereby forming a scintillator sensor unit (Step S15).

The following describes the effects of the first embodiment.

Figure 7:
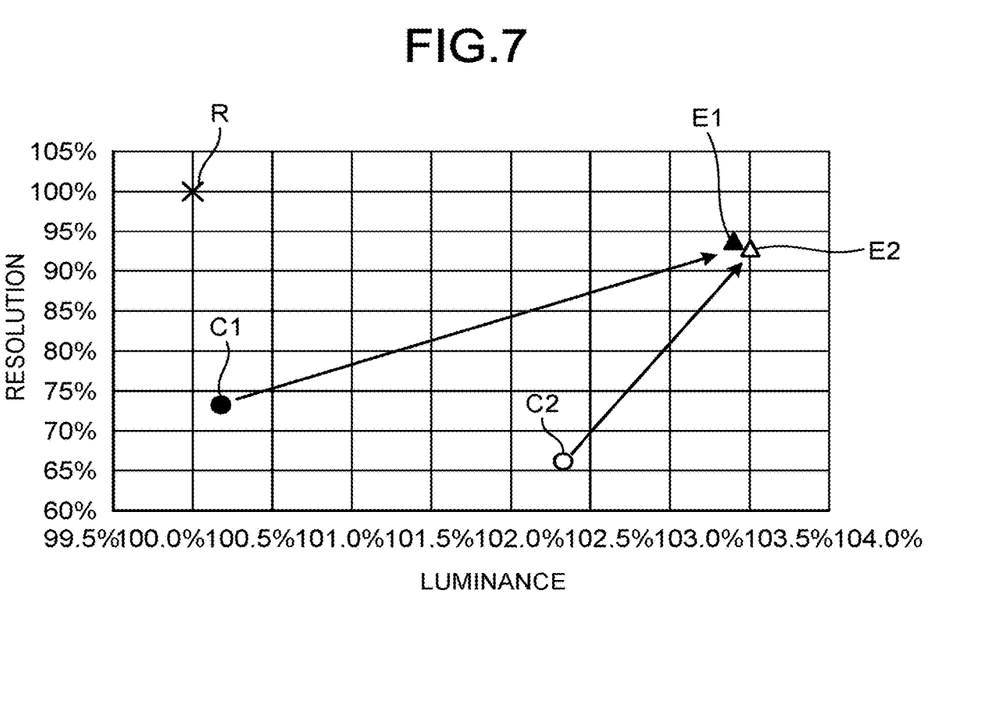
FIG. 7 is a graph illustrating the effects of the first embodiment.

FIG. 7 is a graph illustrating the effects of the first embodiment.

In the example of FIG. 7, a first example E1 and a second example E2 including a moisture-proof film 14P and a moisture-proof film 14Q, respectively, were prepared. The moisture-proof film 14P and the moisture-proof film 14Q, as an example of the moisture-proof film 14A, are made by different manufacturers and have different thicknesses.

The moisture-proof film 14 used was made of a polyethylene terephthalate (PET) base material.

For the sake of comparison, a first comparative example C1 and a second comparative example C2 were also prepared. The first comparative example C1 includes a moisture-proof film 14PX formed of the same material as the moisture-proof film 14P and having a surface on which an adhesive layer is formed, as a conventional moisture-proof film. The second comparative example C2 includes a moisture-proof film 14QX formed of the same material as the moisture-proof film 14Q and having a surface on which an adhesive layer is formed, as a conventional moisture-proof film.

In addition, the first comparative example and the second comparative example have the same structure as the first embodiment that the adhesive layer is placed next to the scintillator layer 12.

Without considering moisture-proof property, a reference example R including only the substrate 11 and the scintillator layer 12 (columnar CsI:T1 crystals) formed thereon was also prepared as a benchmark for comparison of performance.

With reference to the resolution and the luminance of the reference example R defined as 100%, the first example E1 and the second example E2 of the first embodiment and the first comparative example C1 and the second comparative example C2 were compared with each other in terms of resolution and luminance.

As illustrated in FIG. 7, the first comparative example C1 exhibits resolution of 73% and luminance of 100.2%.

The second comparative example C2 exhibits resolution of 66% and luminance of 102.3%.

In contrast, the first example E1 according to the first embodiment exhibits resolution of 93% and luminance of 103.4%.

The second example E2 according to the first embodiment exhibits resolution of 92% and luminance of 103.5%.

Thus, the first example E1 and the second example E2 exhibited improvement in resolution and luminance as compared with the first comparative example C1 and the second comparative example C2, respectively.

According to the first embodiment, as described above, it is made possible to form a scintillator module and a scintillator sensor unit with improved reliability and mechanical strength to be able to perform measurements with higher luminance and higher resolution.

2. Second Embodiment

Figure 8:
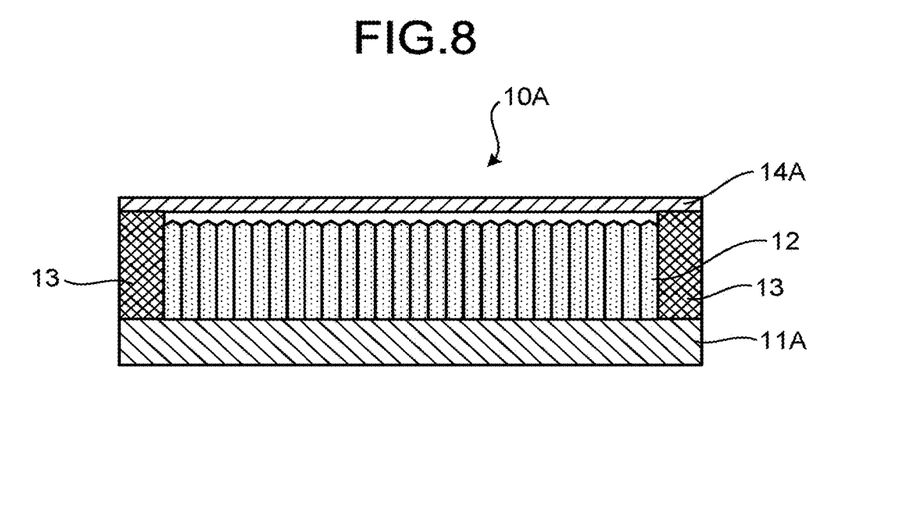
FIG. 8 is a view illustrating a scintillator module according to a second embodiment.

FIG. 8 is a view illustrating a scintillator module according to a second embodiment.

In FIG. 8, the same or like components are denoted by the same reference numerals as those in the first embodiment illustrated in FIG. 1.

A scintillator module 10A according to the second embodiment includes a substrate 11A having a high visible-light transmittance; a scintillator layer 12 formed of columnar CsI:T1 crystals on the substrate 11A by vapor deposition; a seal member 13 having adhesiveness and formed to surround the scintillator layer 12; and a non-adhesive moisture-proof film 14A serving as a non-adhesive layered film. The moisture-proof film 14 has a high visible-light reflectance and is bonded to the seal member 13 to seal the scintillator layer 12 between the moisture-proof film 14A and the substrate 11A.

In the above structure, the moisture-proof film 14A having a high visible-light reflectance may be such that the moisture-proof film 14A itself has a high visible-light reflectance or a reflective layer with a high visible-light reflectance is formed on the moisture-proof film 14A next to the scintillator layer 12.

In the second embodiment, as in the first embodiment, the scintillator layer 12 is sealed by the moisture-proof film 14A in a given vacuum environment. After the sealing, in the scintillator module under the atmospheric pressure a void is present between the peak side of columnar CsI:T1 crystals and the moisture-proof film 14A.

Figure 9:
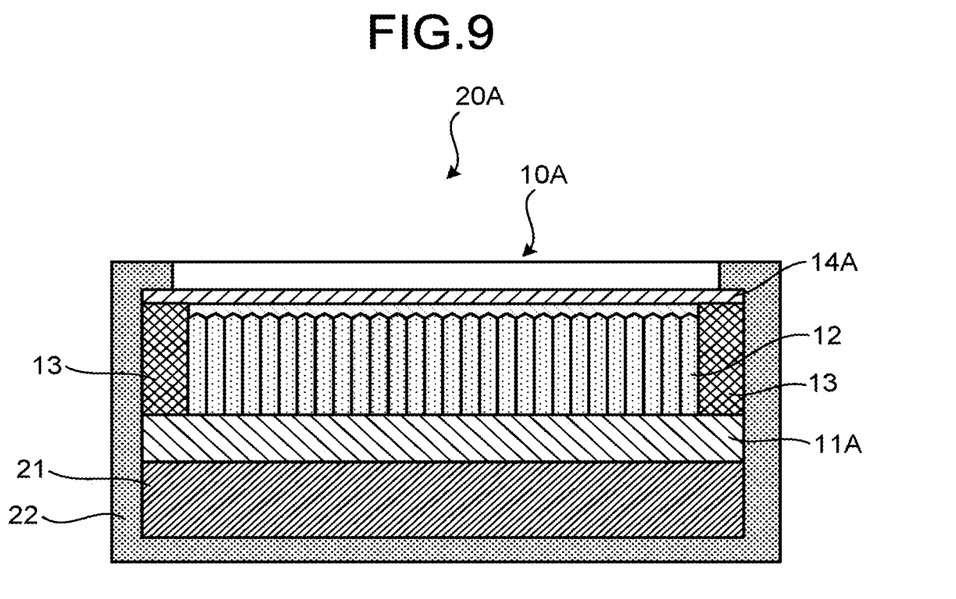
FIG. 9 is a view illustrating a schematic structure of a scintillator sensor unit according to the second embodiment.

FIG. 9 is a view illustrating a schematic structure of a scintillator sensor unit according to the second embodiment.

In FIG. 9, the same or like components are denoted by the same reference numerals as those in the first embodiment illustrated in FIG. 3.

A scintillator sensor unit 20A according to the second embodiment includes a light receiving unit 21 including a plurality of photodiodes arranged in a grid form. The light receiving unit 21 is placed on the root side of the columnar CsI:T1 crystals across the substrate 11A.

Thus, in the scintillator sensor unit 20A of the second embodiment, the moisture-proof film 14A, the scintillator layer 12, and the substrate 11A of the scintillator module 10A, and the light receiving unit 21 are disposed and fixed in order from an X-ray incident side (from above in FIG. 9) inside the casing 22.

Radiation such as an X-ray or a gamma ray is incident on the scintillator sensor unit 20A from above in FIG. 9 and reaches the scintillator layer 12.

With reference to FIG. 4 again, a manufacturing process of the scintillator sensor unit according to the second embodiment is now described.

A fabrication procedure of the scintillator module in the second embodiment is described first.

Firstly, CsI:T1 is vapor-deposited on the substrate 11A having a high visible-light transmittance, to create the scintillator layer 12 formed of columnar CsI:T1 crystals of a rectangular shape in a plan view (Step S11).

Subsequently, the adhesive seal member 13 is placed so as to surround the scintillator layer 12 on the substrate 11A and adhere to the substrate 11A (Step S12).

The substrate 11A to which the seal member 13 adheres and the moisture-proof film 14A are then placed under a vacuum environment. The moisture-proof film 14A is set such that the reflective layer side faces the scintillator layer 12, and is press-bonded to the seal member 13 for vacuum-sealing (Step S13).

Consequently, a void is formed between the moisture-proof film 14A and the scintillator layer 12, preventing the moisture-proof film 14A from tightly adhering to the unevenness ascribable to the conic portions of the peaks of columnar CsI:Tl crystals. Thereby, the scintillator sensor unit can attain higher luminance and higher resolution.

Next, the light receiving unit 21 is placed in the casing 22 (Step S14).

The scintillator module 10 is then set opposite the light receiving unit 21 and fixed in the casing 22, forming the scintillator sensor unit (Step S15).

The following describes the effects of the second embodiment.

Figure 10:
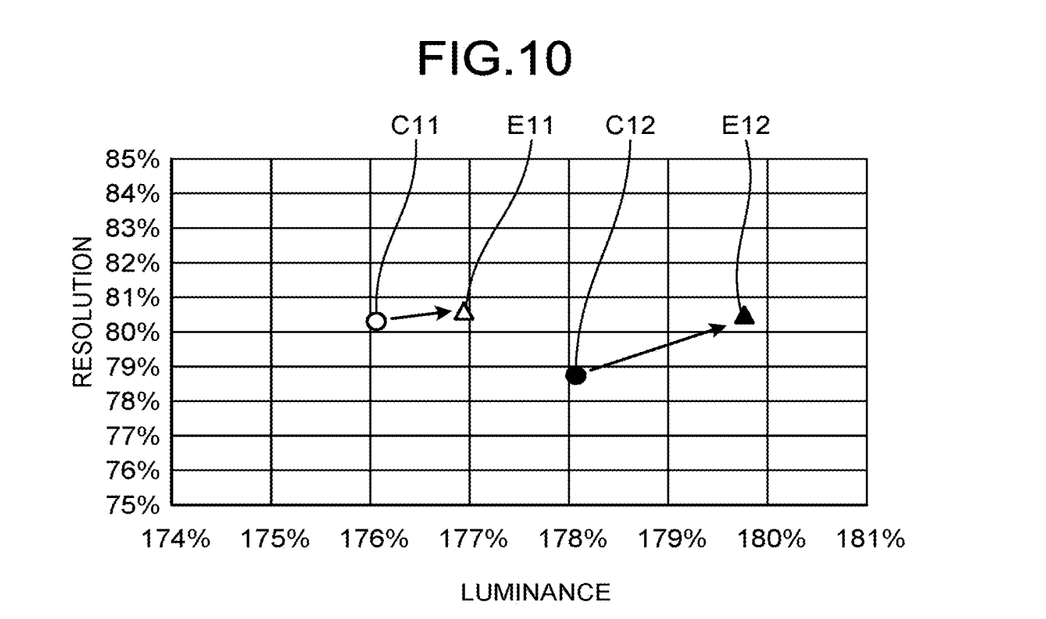
FIG. 10 is a graph illustrating the effects of the second embodiment.

FIG. 10 is a graph illustrating the effects of the second embodiment.

In the example of FIG. 10, a first example E11 and a second example E12 including a moisture-proof film 14S and a moisture-proof film 14T, respectively, were prepared. The moisture-proof film 14S and the moisture-proof film 14T, as an example of the moisture-proof film 14A, have different high visible-light reflectances, and are made by different manufacturers and have different thicknesses.

In this example, the moisture-proof films 14S and 14T used are made of a PET base material.

For the sake of comparison, a first comparative example C11 and a second comparative example C12 were also prepared. The first comparative example C11 includes a moisture-proof film 14SX formed of the same material as the moisture-proof film 14S and having a surface on which an adhesive layer with a high visible-light reflectance is formed, as a conventional one. The second comparative example C12 includes a moisture-proof film 14TX formed of the same material as the moisture-proof film 14T and having a surface on which an adhesive layer with a high visible-light reflectance is formed, as a conventional one.

The first comparative example C11 and the second comparative example C12 have the same structure as the second embodiment that the adhesive layers are placed next to the corresponding scintillator layers 12.

FIG. 10 illustrates an example of, as in the first embodiment, relative values of luminance and resolution with respect to those of a reference example R, which are defined as 100%. The reference example R includes only the substrate 11 and the scintillator layer 12. (columnar (CsI:Tl crystals) formed thereon without considering a moisture-proof property.

As illustrated in FIG. 10, the first comparative example C11 exhibits resolution of 80.2% and luminance of 176.2%.

The second comparative example C12 exhibits resolution of 78.8% and luminance of 178.2%.

In contrast, the first example E11 according to the second embodiment exhibits resolution of 80.5% and luminance of 176.9%.

The second example E12 according to the second embodiment exhibits resolution of 80.4% and luminance of 179.8%.

As seen above, the first example E11 and the second example E12 exhibited improvement in terms of resolution and luminance as compared with the first comparative example C11 and the second comparative example C12, respectively.

As described above, according to the second embodiment it is possible to form a scintillator module and a scintillator sensor unit with improved reliability and mechanical strength to be able to perform measurements with higher luminance and higher resolution.

2.1. Modification of Second Embodiment

Figure 11:
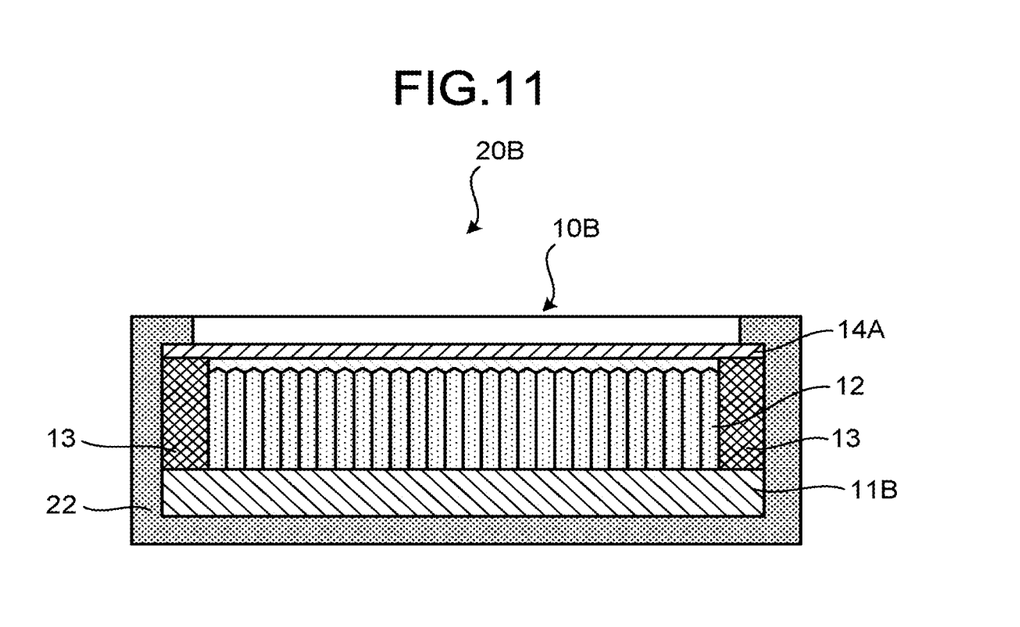
FIG. 11 is a view illustrating a modification of the second embodiment.

FIG. 11 is a view illustrating a modification of the second embodiment.

In the above description, the scintillator module 10A and the light receiving unit 21 are separately formed. However, it is possible to form a scintillator module 10B and a light receiving unit in a united manner by forming, as a substrate 11B, a sensor board on which elements such as photodiodes and thin-film transistors (TFTs) are two-dimensional arrayed by semiconductor fabrication technology and directly adding the scintillator layer 12 on the substrate 11B.

Owing to such a formation, a scintillator sensor unit 20B can be decreased in thickness, which enables a higher degree of freedom in designing various devices including such a scintillator sensor unit and downsizing of the devices.

3. Modification of Embodiments

The above has described the examples of a moisture-proof film including no adhesive layer. However, it is possible to prevent the moisture-proof film 14 including an adhesive layer as a conventional one from adhering to the scintillator layer 12 by attaching a resin sheet with a given degree of hardness in-between the adhesive layer and the scintillator layer 12.

In this case, as in the first embodiment and the second embodiment, the resin sheet may be placed apart from or in contact with the scintillator layer 12.

In the above structure, the use of the resin sheet is intended for preventing an adhesive of an adhesive layer from covering the entire conic surface of conic portions of the columnar crystals of the scintillator, and for maintaining the flatness of the moisture-proof film 14.

The invention claimed is:
1. A scintillator module, comprising:
    a substrate;
    a columnar scintillator crystal layer formed on the substrate;
    a non-adhesive moisture-proof member opposing a crystal growing side of the columnar scintillator crystal layer, and having a hardness to ensure, under a vacuum sealing, a void between the moisture-proof member and individual conic peak portions of columnar scintillator crystals forming the columnar scintillator crystal layer, to hold the columnar scintillator crystal layer in a moisture-proof state between the moisture-proof member and the substrate; and
    an adhesive seal member having a height to ensure the void and disposed on the substrate to surround the columnar scintillator crystal layer and support the moisture-proof member.
2. The scintillator module according to claim 1, wherein
    the substrate, the columnar scintillator crystal layer, and the moisture-proof member are disposed in order from a radiation incident side,
    the substrate is formed of a material having a high visible-light reflectance, and
    the moisture-proof member is formed of a material having a high visible-light transmittance.

3. The scintillator module according to claim 1, wherein
the moisture-proof member, the columnar scintillator crystal layer, and the substrate are disposed in order from a radiation incident side,
the moisture-proof member is formed of a material having a high visible-light reflectance, and
the substrate is formed of a material having a high visible-light transmittance.

4. A scintillator sensor unit, comprising:
the scintillator module according to claim 1;
a light receiving unit located opposite a radiation incident side with respect to the scintillator module, the light receiving unit being configured to receive visible light after being converted by the columnar scintillator crystal layer; and
a casing that holds the scintillator module and the light receiving unit in given positions.

5. A scintillator sensor unit, comprising:
the scintillator module according to claim 1; and
a casing that holds the scintillator module in a given position, wherein
the moisture-proof member, the columnar scintillator crystal layer, and the substrate are disposed in order from a radiation incident side,
the moisture-proof member is formed of a material having a high visible-light reflectance, and
the substrate includes a sensor board on which photodiodes and thin-film transistors are two-dimensionally arrayed by semiconductor fabrication technology.

6. A manufacturing method of a scintillator module, the method comprising:
forming a columnar scintillator crystal layer on a given substrate;
placing an adhesive seal member on the substrate in such a manner that the seal member surrounds the columnar scintillator crystal layer, and allows the seal member to adhere to the substrate;
placing the substrate and a non-adhesive moisture-proof member under a vacuum environment, the moisture-proof member having a hardness to ensure a void under a vacuum sealing;
setting the moisture-proof member opposite the columnar scintillator crystal layer, and press-bonding the moisture-proof member to the substrate; and
vacuum-sealing the moisture-proof member and the substrate while ensuring a void between the moisture-proof member and individual conic peak portions of columnar scintillator crystals forming the columnar scintillator crystal layer.

7. A manufacturing method of a scintillator sensor unit, the method comprising:
forming a columnar scintillator crystal layer on a given substrate;
placing an adhesive seal member on the substrate in such a manner that the adhesive seal member surrounds the columnar scintillator crystal layer and allows the adhesive seal member to adhere to the substrate;
placing the substrate and a non-adhesive moisture-proof member under a vacuum environment, the moisture-proof member having a hardness to ensure a void under a vacuum sealing;
setting the moisture-proof member opposite the columnar scintillator crystal layer, and press-bonding the moisture-proof member to the substrate;
vacuum-sealing the moisture-proof member and the substrate while ensuring a void between the moisture-proof member and individual conic peak portions of columnar scintillator crystals forming the columnar scintillator crystal layer, to form a scintillator module; and
storing and holding the scintillator module and a light receiving unit in a casing in a given positional relationship.

* * * * *